(12) United States Patent
Baer et al.

(10) Patent No.: US 9,671,703 B2
(45) Date of Patent: Jun. 6, 2017

(54) OPTICAL ARRANGEMENT, EUV LITHOGRAPHY APPARATUS AND METHOD FOR CONFIGURING AN OPTICAL ARRANGEMENT

(71) Applicant: Carl Zeiss SMT GmbH, Oberkochen (DE)

(72) Inventors: Norman Baer, Aalen (DE); Toralf Gruner, Aalen-Hofen (DE); Ulrich Loering, Schwaebisch Gmuend (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 436 days.

(21) Appl. No.: 14/309,017

(22) Filed: Jun. 19, 2014

(65) Prior Publication Data

US 2014/0300876 A1 Oct. 9, 2014

Related U.S. Application Data

(63) Continuation of application No. PCT/EP2013/050553, filed on Jan. 14, 2013.

(30) Foreign Application Priority Data

Jan. 25, 2012 (DE) ........................ 10 2012 201 075

(51) Int. Cl.
*G03B 27/52* (2006.01)
*G03B 27/68* (2006.01)
(Continued)

(52) U.S. Cl.
CPC ..... *G03F 7/70891* (2013.01); *G02B 17/0663* (2013.01); *G03F 7/706* (2013.01); *G03F 7/70316* (2013.01); *G03F 7/70958* (2013.01)

(58) Field of Classification Search
CPC ............ G02B 17/0663; G03F 7/70316; G03F 7/70891; G03F 7/70966; G03F 7/7015;
(Continued)

(56) References Cited

U.S. PATENT DOCUMENTS 7,324,269 B2 1/2008 Sasaki
2003/0063375 A1 4/2003 Suzuki et al.
(Continued)

FOREIGN PATENT DOCUMENTS

CN 1488994 A 4/2004
CN 1576903 A 2/2005
(Continued)

OTHER PUBLICATIONS

Chinese Office Action, with English translation, for corresponding CN Appl No. 201380006839.X, dated Sep. 21, 2015.
(Continued)

*Primary Examiner* — Christina Riddle
(74) *Attorney, Agent, or Firm* — Fish & Richardson P.C.

(57) ABSTRACT

The invention relates to an optical arrangement comprising: at least one optical element comprising an optical surface and a substrate, wherein the substrate is formed from a material whose temperature-dependent coefficient of thermal expansion at a zero crossing temperature $\Delta T_{ZC} = T_{ZC} - T_{ref}$ related to a reference temperature $T_{ref}$ is equal to zero, wherein the optical surface has, during the operation of the optical arrangement, a location-dependent temperature distribution $\Delta T(x, y)$ that is dependent on a local irradiance (5a), is related to the reference temperature $T_{ref}$ and has an average temperature $\Delta T_{av}$, a minimum temperature $\Delta T_{min}$ and a maximum temperature $\Delta T_{max}$, wherein the average temperature $\Delta T_{av}$ is less than the average value $1/2 (\Delta T_{max} + \Delta T_{min})$ formed from the minimum temperature $\Delta T_{min}$ and the maximum temperature $\Delta T_{max}$, and wherein the zero
(Continued)

Figure 1:
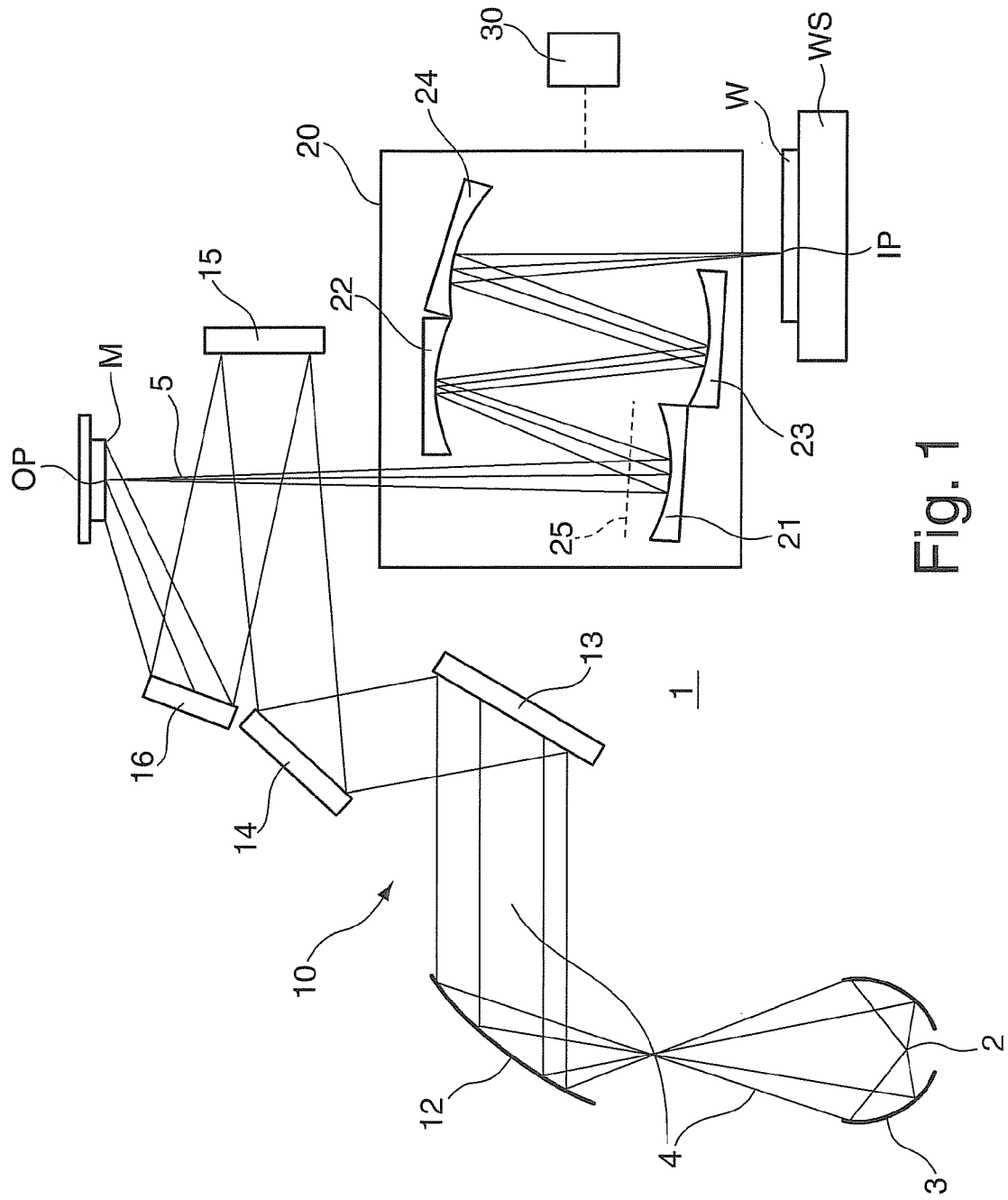

crossing temperature $\Delta T_{ZC}$ is greater than the average temperature $\Delta T_{av}$.

24 Claims, 3 Drawing Sheets

(51) Int. Cl.
- *G03B 27/54* (2006.01)
- *G03B 27/32* (2006.01)
- *G03F 7/20* (2006.01)
- *G02B 17/06* (2006.01)

(58) Field of Classification Search
CPC .. G03F 7/702; G03F 7/70233; G03F 7/70308; G03F 7/706
USPC ......... 355/30, 52, 53, 55, 60, 66, 67–71, 77; 250/492.1, 492.2, 492.22, 493.1, 503.1, 250/504 R; 359/395, 512, 820, 845
See application file for complete search history.

(56) References Cited

U.S. PATENT DOCUMENTS

| | | | |
|---|---|---|---|
| 2003/0125184 A1* | 7/2003 | Mitra | C03B 32/02 501/7 |
| 2003/0235682 A1* | 12/2003 | Sogard | G03F 7/70233 428/195.1 |
| 2004/0063004 A1 | 4/2004 | Alkemper et al. | |
| 2004/0095567 A1 | 5/2004 | Ohsaki et al. | |
| 2005/0024614 A1 | 2/2005 | Bakker | |
| 2005/0110967 A1* | 5/2005 | Hara | G05D 23/1919 355/30 |
| 2005/0134973 A1 | 6/2005 | Pilz et al. | |
| 2005/0190347 A1* | 9/2005 | Suzuki | G03F 7/70958 355/30 |
| 2005/0197242 A1 | 9/2005 | Mitra et al. | |
| 2005/0207001 A1 | 9/2005 | Laufer et al. | |
| 2008/0004169 A1 | 1/2008 | Ellison | |
| 2009/0028421 A1* | 1/2009 | Sukegawa | G03F 7/70425 382/144 |
| 2009/0231707 A1 | 9/2009 | Ehm et al. | |
| 2010/0080647 A1* | 4/2010 | Terasawa | B82Y 10/00 403/5 |
| 2010/0200777 A1 | 8/2010 | Hauf | |
| 2011/0181855 A1 | 7/2011 | Bittner et al. | |
| 2011/0205516 A1 | 8/2011 | DeVries et al. | |
| 2013/0120863 A1 | 5/2013 | Kaller et al. | |

FOREIGN PATENT DOCUMENTS

| | | |
|---|---|---|
| CN | 1657462 A | 8/2005 |
| CN | 101201451 A | 6/2008 |
| CN | 101495921 A | 7/2009 |
| DE | 102008042356 | 4/2010 |
| DE | 102009013720 A1 | 9/2010 |
| DE | 102010028488 | 11/2011 |
| EP | 1418468 A2 | 5/2004 |
| JP | 2003-045782 A | 2/2003 |
| JP | 2005-228875 A | 8/2005 |
| JP | 2007-013054 A | 1/2007 |
| JP | 2008-130827 A | 6/2008 |
| JP | 2011-512018 A | 4/2011 |
| JP | 2011-176311 A | 9/2011 |
| WO | WO 2009/059614 | 5/2009 |
| WO | WO 2012/013747 | 2/2012 |

OTHER PUBLICATIONS

German Office Action, with translation thereof, for DE 10 2012 201 075.0, dated Sep. 18, 2012.

International Search Report and Written Opinion for corresponding PCT Appln No. PCT/EP2013/050553, dated Apr. 22, 2013.

Japanese Office Action, with translation thereof, for corresponding JP Appl No. 2014-553668, dated Sep. 8, 2016.

\* cited by examiner

OPTICAL ARRANGEMENT, EUV LITHOGRAPHY APPARATUS AND METHOD FOR CONFIGURING AN OPTICAL ARRANGEMENT

CROSS-REFERENCE TO RELATED APPLICATIONS

This application is a continuation of, and claims benefit under 35 USC 120 to, international application PCT/EP2013/050553, filed Jan. 14, 2013, which claims priority to German Patent Application No. 10 2012 201 075.0, filed on Jan. 25, 2012. The entire disclosure of international application PCT/EP2013/050553 and German patent application No. 0 2012 201 075.0 are incorporated by reference herein.

BACKGROUND OF THE INVENTION

The invention relates to an optical arrangement, for example a projection lens for microlithography, in particular for EUV lithography, an EUV lithography apparatus comprising such a projection lens, and a method for configuring an optical arrangement.

Reflective optical elements (mirrors) having a dielectric coating are used in optical arrangements for EUV lithography. Such mirrors have a reflectivity of typically less than 70% for the impinging EUV radiation, such that a considerable proportion of radiation is absorbed by the mirrors and converted into heat. Materials used as substrates for mirrors in EUV lithography are permitted to have only a very low coefficient of thermal expansion (CTE) in the range of the operating temperatures used there, on account of the extremely stringent requirements in respect of geometrical tolerances and stability that have to be imposed on the mirror surfaces in particular in projection lenses used there. In order to achieve this, the substrate materials used in EUV lithography typically have two constituents, the coefficients of thermal expansion of which have a mutually opposite dependence on temperature, such that the coefficients of thermal expansion almost completely compensate for one another at the temperatures that occur at the mirrors during the operation of the EUV lithography apparatus.

A first group of materials that satisfies the stringent requirements with regard to the CTE for EUV applications is doped silicate glasses, e.g. silicate or quartz glass doped with titanium dioxide, typically having a silicate glass proportion of more than 80%. One such silicate glass that is commercially available is sold by Corning Inc. under the trade name ULE® (Ultra Low Expansion glass). It goes without saying that $TiO_2$-doped quartz glass can, if appropriate, also be doped with further materials, e.g. with materials which reduce the viscosity of the glass, as is explained e.g. in US 2008/0004169 A1, wherein alkali metals are used, inter alia, in order to reduce the effects of striae in the glass material.

A second group of materials suitable as substrates for EUV mirrors is glass ceramics, in which the ratio of the crystal phase to the glass phase is set such that the coefficients of thermal expansion of the different phases almost cancel one another out. Such glass ceramics are offered e.g. under the trade name Zerodur® by Schott A G or under the trade is name Clearceram® by Ohara Inc.

The dependence of the thermal expansion (change in length) of the above-described materials on temperature is approximately parabolic in the relevant temperature range, that is to say that there is an extremum of the thermal expansion at a specific temperature. The derivative of the thermal expansion of zero expansion materials with respect to temperature (i.e. the coefficient of thermal expansion) is approximately linearly dependent on temperature in this range and changes sign at the temperature at which the thermal expansion is an extremum, for which reason this temperature is designated as the zero crossing temperature (ZCT). Consequently, the thermal expansion is minimal only for the case where the operating or working temperature of the substrate coincides with the zero crossing temperature.

The zero crossing temperature can be set within certain limits during the production of the substrate materials or the blanks, for example by choosing suitable parameters during heat treatment or, in the case of $TiO_2$-doped quartz glass, by setting the titanium dioxide proportion used during the production of the quartz glass. The zero crossing temperature in the substrate and in particular in the vicinity of the optical surface is in this case typically set to be as homogeneous as possible.

However, the radiation intensity or irradiance impinging on the optical surfaces during the operation of the mirrors is not homogeneous and varies in a location-dependent manner, which means that the resulting temperature distribution at the optical surface is also inhomogeneous. Consequently, the condition that the operating temperature corresponds to the zero crossing temperature cannot be fulfilled at the entire surface, such that the latter in the case of operation is not totally insensitive to temperature and thus free of deformation. Although the coefficient of thermal expansion is still small in the case of small deviations of the operating temperature from the zero crossing temperature, it increases further as the temperature difference with respect to the zero crossing temperature increases, which can lead to deformations of the reflective surface on account of the locally different linear expansion and to deformation-governed wavefront aberrations.

OBJECT OF THE INVENTION

It is an object of the invention to provide an optical arrangement, an EUV lithography apparatus and a method for configuring an optical arrangement in which the operating temperature (or the average temperature) and the zero crossing temperature of at least one, in particular all, of the optical elements are coordinated with one another so as to reduce or minimize wavefront aberrations.

SUBJECT MATTER OF THE INVENTION

This object is achieved via an optical arrangement, for example a projection lens for microlithography, in particular for EUV lithography, comprising: at least one optical element comprising an optical surface and a substrate, wherein the substrate is formed from a material whose temperature-dependent coefficient of thermal expansion at a zero crossing temperature related to a reference temperature is equal to zero, wherein the optical surface has, during the operation of the optical arrangement, a location-dependent temperature distribution that is dependent on a local irradiance, is related to the reference temperature and has an average temperature, a minimum temperature and a maximum temperature, wherein the average temperature is less than the average value of the minimum temperature and the maximum temperature, and wherein the zero crossing temperature is greater than the average temperature.

It would actually be expected that, in order to minimize wavefront aberrations, the zero crossing temperature and the average temperature at the optical surface should coincide.

The inventors have discovered that such a choice is indeed advantageous if the frequency distribution of the temperature at the surface is a distribution that is symmetrical with respect to the average temperature of the surface (e.g. a Gaussian distribution). If the frequency distribution is asymmetrical, that is to say if the arithmetic mean of the maximum and minimum temperatures deviates from the average temperature (which is determined by integration of the location-dependent temperature distribution over the surface), for reducing wavefront aberrations it is more advantageous if the average temperature does not coincide with the zero crossing temperature.

In this case, the dependence is such that in the case of a frequency distribution of the temperature in which the average temperature lies below the arithmetic mean of maximum and minimum temperatures, the average temperature should be chosen to be less than the zero crossing temperature, whereas in the opposite case, that is to say if the average temperature is greater than the arithmetic mean of minimum temperature and maximum temperature, the average temperature should be chosen to be, if appropriate, greater than or equal to the zero crossing temperature. It is stated in the description below that the first case can occur in particular for optical elements of projection lenses for EUV lithography that are in proximity to the pupil. It goes without saying that the frequency distribution and the location-dependent distribution of the temperature are not identical, such that a symmetrical (e.g. Gaussian) location-dependent temperature distribution at the optical surface does not lead to a symmetrical frequency distribution of the temperature values at the surface, and vice versa.

In one embodiment, the optical arrangement comprises a temperature regulating device for regulating the temperature of, in particular for heating, the optical element, that is to say the substrate and/or the optical surface, and also a temperature control device, which is designed for setting, in particular for closed-loop control, of the average temperature (or of the operating temperature) at the optical surface. In this embodiment, the optical element, that is to say the substrate or, if appropriate, directly the optical surface is temperature-regulated (that is to say heated or, if appropriate, cooled). This is advantageous in order to reduce time-dependent (transient) temperature fluctuations at the optical surface. The temperature control device can control the supply of heat to the substrate by open-loop or closed-loop control in such a way that an average temperature at the optical element or the substrate is attained which leads to a desired average temperature at the optical surface of the optical element, in particular in the optically used surface region, wherein the desired temperature can be e.g. below the zero crossing temperature. It goes without saying that the radiation power which impinges on the optical surface and/or on the substrate has to be taken into account for the optimal open-loop control of the supply of heat. If appropriate, one or more temperature sensors can be provided which detect the temperature of the substrate and/or of the optical surface and which can be used by the temperature control device for closed-loop control of the temperature. The temperature regulating device typically serves for heating or cooling the substrate as homogeneously as possible; if appropriate, however, the substrate can also be heated or cooled inhomogeneously, for example if a plurality of mutually independently controllable heating or cooling elements are provided. The temperature of the substrate that is set during temperature regulation generally does not correspond to the average temperature at the reflective surface, since additional heat transfer effects (e.g. as a result of convection) can occur there. These effects should be taken into account in the setting of the temperature of the substrate in order to obtain the desired average temperature at the optical surface. If appropriate, temperature regulation (typically heating) of the optical surface (and/or of the substrate) can also be effected by additionally applying thermal radiation, for example infrared radiation, to the surface.

In one development, the temperature control device is designed to set a difference between the average temperature and the zero crossing temperature in a manner dependent on the local irradiance at the optical surface, that is to say that not only is the average temperature chosen to be lower than the zero crossing temperature, but in addition the deviation (difference) of the average temperature from the zero crossing temperature is defined in a manner dependent on the local irradiance which affects the frequency distribution of the temperature and thus the wavefront aberrations caused at the optical surface. In this case, by way of example, a respective local irradiance can be assigned to a respective operating case that is characterized by specific operating parameters (e.g. illumination settings, radiation intensity of the light source, etc.).

The assignment between the operating case or the operating parameters and the difference respectively to be used can be implemented in the temperature control device by virtue of the corresponding assignment being saved or stored there. In this way, the temperature control device can take the associated value for the difference from a table, for example, and directly set it. Alternatively or additionally, the location-dependent temperature distribution can also be measured or simulated during operation and it is possible to determine or calculate the frequency distribution of the temperature, the properties thereof and the effects thereof on the form of the surface or the wavefront aberration. In any case the temperature control device is designed or programmed to adapt the average temperature to the respective application.

In this case, the difference between the zero crossing temperature and the operating temperature, that is to say for example the average temperature at the optical surface, can be set in particular so as to minimize a measure of the wavefront aberration at the optical surface. The difference respectively to be chosen is dependent on the measure of the wavefront aberration which is intended to be minimized.

As will be shown further below, in order to minimize the RMS value of the surface it is possible to set the difference between the zero crossing temperature and the average temperature to be equal to the quotient of $1/2 \langle \delta T^3 \rangle / \langle \delta T^2 \rangle$, wherein $\delta T$ denotes the deviation of the temperature distribution from the average value $\Delta T_{av}$ of the temperature distribution, that is to say that $\Delta T(x,y)=\Delta T_{av}+\delta T(x,y)$. $\langle \delta T^2 \rangle$ denotes the averaging of $\delta T^2$ over the surface, and $\langle \delta T^3 \rangle$ denotes the averaging of the third power over the surface.

In optics, the RMS value of the wavefront is often minimized, as is required e.g. by the known variables "Strehl definition brightness" or loss of contrast. This ultimately involves minimizing the integral over the square of the local wavefront deviation (an average value is subtracted beforehand as unimportant). This method is also known as the Gaussian least squares method.

In many cases, the wavefront deviation itself is proportional to a local area parameter of which a constant portion can be compensated for. In this situation, the RMS optimization requires the compensating constant to be chosen to be equal to the average value over this local area parameter. However, if—as in the present case—the wavefront deviation is higher than linearly dependent on the local area parameter, larger deviations are punished in the RMS value more severely than a reduction is rewarded. The optimum for the compensating constant (here: the zero crossing temperature, ZCT for short) then moves in the direction of those values which occupy a smaller area and are therefore further away from the average value. In the present case, the wavefront has e.g. a contribution which is quadratically dependent on the local deviation of the temperature from the zero crossing temperature (as compensating constant).

In the associated RMS integral, this difference occurs with a higher power than quadratic. If the zero crossing temperature is therefore shifted in the direction of a temperature that occupies a smaller area portion of the optical surface, then the error contribution as a result of this area portion will decrease to a greater extent than the area contribution of those values which occupy the larger area increases (extremum property: precisely in the case of the power 2, this change in a minimal environment of the average value would be close to zero). Overall, the target function decreases as a result of this change, and so an optimum zero crossing temperature is established close to the less frequently occurring temperature values.

During the operation of the optical arrangement, generally the zero crossing temperature itself is not influenced, rather the average temperature of the respective optical element is adapted to it, that is to say that the value "average temperature of the optical element—zero crossing temperature" is optimized. This adaptation is often also referred to for simplification as (relative) ZCT adaptation.

In one development, the average temperature at all the optical elements of the optical arrangement is set so as to minimize a measure of the wavefront aberration of the optical arrangement. In the case of an imaging optical arrangement (projection lens), for example, the wavefront aberrations of the optical arrangement can be measured on the aerial image in the image plane and are referred to as image aberrations in this case. In order to realize diffraction-limited projection optical units, it is typically necessary, for example, for the RMS value ("root mean square"), of the wavefront aberrations that occur in the image plane to be less than $1/14$ of the wavelength of the imaging light. This specification can typically be complied with by a suitable choice of the deviations between the operating temperature and the zero crossing temperature at the individual mirrors.

However, measures of the wavefront aberration (image aberration) other than the RMS value of the surface can also be optimized or minimized, for example scale error, telecentricity error, overlay, depth of focus, best focus, etc. In order to determine these and further wavefront aberrations, the wavefront can be determined at a plurality of points in the image plane and numerically decomposed into an orthogonal function system. The (Zernike) coefficients at different field points can be grouped into RMS values which are characteristic of a specific type of aberration (e.g. coma, astigmatism, etc.), as is described in DE 10 2008 042 356 A1 in the name of the present applicant, for example, to which reference is made in its entirety. These RMS values or combinations thereof can likewise be used as a measure of the wavefront aberration.

In one development, the temperature control device is designed to adapt a heating power of the temperature regulating device to a radiation power absorbed by the substrate in such a way that the total thermal energy taken up by the substrate and thus the average temperature of the substrate and/or of the optical surface remain constant. In the inactive state, in which radiation is not applied to the optical arrangement, the optical elements typically have a temperature that substantially corresponds to the reference temperature. In the active operating state, in which the full radiation power is applied to the optical surfaces, a steady-state temperature distribution and thus also a steady-state average temperature at the optical elements are typically established. Upon transition from the inactive to the active operating state, the temperature distribution (without additional heating) is time-dependent and the average temperature increases until the steady-state temperature state is reached, since more radiation power is absorbed than can be emitted to the environment.

In order to minimize the temperature increase in the transient case and/or temperature fluctuations at the optical surfaces in the operating case, it is possible to use the heating device. By way of example, as early as before irradiation, the heating device can heat the substrates and/or the optical surfaces to the steady-state temperature established during operation. In the transient case, in which radiation power additionally reaches the mirrors and is absorbed by the substrates, the heating power has to be correspondingly reduced or adapted in order to keep the average temperature constant.

In a further embodiment, the zero crossing temperature is at least 0.1 K, preferably at least 0.2 K, in particular at least 0.4 K, if appropriate at least 0.7 K, greater than the average temperature at the optical surface. The deviation of the zero crossing temperature from the average temperature can, if appropriate, be considerable and even be at least 1 kelvin, 1.3 K, 1.5 K, 1.7 K, 2.0 K, 2.5 K etc., wherein the value suitable for minimizing the aberrations is dependent on the frequency distribution of the temperature values at the optical surface (see above).

In one embodiment, the optical surface has a first area portion $A_1$, at which the temperature at the surface is greater than the average temperature, and a second area portion $A_2$, at which the temperature at the surface is less than the average temperature, wherein the first area portion is smaller than the second area portion ($A_1 < A_2$). For this case, the zero crossing temperature should be chosen to be greater than the average temperature at the optical surface.

In a further embodiment, the optical element is arranged in or in proximity to a pupil plane. An arrangement in proximity to a pupil is understood to mean an arrangement of the optical element which has a subaperture ratio of at least 70%. The subaperture ratio assumes values of between 0 and 1 and has the value 1 in a pupil plane and the value 0 in a field plane. For an optical system which images an object field having a maximum object height onto an image field under a given aperture, e.g. a projection lens for (EUV) lithography, the subaperture ratio is defined as follows: $|R-H|/(|R-H|+|H|)$, wherein, on the basis of an object point having a maximum object height, R is the marginal ray height and H is the chief ray height and these ray heights are measured in a given plane that is parallel to a pupil plane of the optical system.

The field distribution or the local irradiance at the optical surface of an optical element in proximity to the pupil substantially corresponds to the angular distribution (pupil) of the illumination radiation which enters into the imaging optical system. In the case of a projection lens, the illumination pupil is convolved with the diffraction pattern of the object to be imaged (mask), but this generally does not result in a significant change since the zeroth diffraction order often provides a dominant contribution. In particular in new or future EUV lithography apparatuses, only a small percentage (e.g. of less than 50%) of the illumination pupil is illuminated, and so the proportion of irradiated surface regions relative to the total area of the surface is likewise less than 50% and localized regions having a high temperature and great temperature gradients and larger areas having a lower temperature result ($A_1<A_2$, see above), such that the zero crossing temperature in the case of optical elements in proximity to the pupil should be chosen to be greater than the average temperature.

In a further embodiment, the optical element has a coating that is reflective to EUV radiation, that is to say that the optical element is an EUV mirror. In this case, the optical surface of the EUV mirror typically corresponds to the region of the substrate which is provided with the coating. The optical surface of such a mirror can be embodied in a planar fashion, but the optical surface generally has a (for example spherical) curvature. It goes without saying that, if appropriate, modifications, e.g. a (central) through-opening, can also be provided at the optical surface. In this case, of course, the averaging or the determination of the RMS value takes place only in the surface region in which the substrate or the reflective coating is present, that is to say that the surface region of the through-opening is not taken into account in the averaging.

A further aspect of the invention relates to an EUV lithography apparatus comprising an optical arrangement in the form of a projection lens embodied as described above. By suitably adapting the operating temperature of one or more mirrors of the projection lens, it is possible to reduce or minimize the imaging aberrations of the projection lens. It goes without saying that the local irradiance is dependent on the illumination settings (e.g. dipole illumination, annular illumination, etc.) of an illumination system disposed upstream of the projection lens and the exact value of the average temperature of the optical surfaces should be adapted to these settings. The projection lens for EUV lithography, in which the optical elements are arranged, can comprise a vacuum housing and also a vacuum pump in order to produce a residual gas atmosphere having a total pressure of e.g. less than $10^{-4}$ mbar, preferably of less than $10^{-3}$ mbar, in the interior of the housing. The vacuum pump can be driven or controlled by closed-loop control for example such that a hydrogen partial pressure in the vacuum housing is less than $10^{-1}$ mbar. The projection lens or the EUV lithography apparatus can also comprise a cleaning device for cleaning the optical surfaces, to put it more precisely the top side of the multilayer coating of at least one EUV mirror. The cleaning device can be designed for example for applying a cleaning gas e.g. in the form of activated hydrogen to at least one surface to be cleaned, in order to remove contamination present there. The cleaning device can comprise a gas nozzle and can be designed as in WO 2009/059614 A1 in the name of the present applicant, for example, which is incorporated by reference in the content of this application.

In one embodiment, the EUV lithography apparatus comprises an illumination system designed for generating an illumination ray with an illumination pupil having a pupil filling of less than 50%, preferably of less than 30%, particularly preferably of less than 15%, in particular of less than 1%. As was explained further above, in the case of such a low pupil filling at least at EUV mirrors in proximity to the pupil a situation is systematically given in which $A_1<A_2$ holds true and, consequently, the zero crossing temperature should be chosen to be greater than the average temperature in order to minimize wavefront aberrations.

A further aspect of the invention relates to a method for configuring an optical arrangement comprising at least one optical element which comprises an optical surface and also a substrate. The substrate is formed from a material whose temperature-dependent coefficient of thermal expansion at a zero crossing temperature related to a reference temperature is equal to zero. The method comprises the following steps: determining a local irradiance to be expected at the optical surface of the optical element, which irradiance is generated during the operation of the optical arrangement, determining a location-dependent temperature distribution that results from the irradiance at the optical surface, is related to a reference temperature and has an average temperature, a minimum temperature and a maximum temperature, determining whether the average temperature at the optical surface is less than the average value formed from the minimum temperature and the maximum temperature and, if this is the case: producing the optical element from a substrate whose zero crossing temperature is greater than the average temperature.

The method involves firstly determining an irradiation load or area irradiance (irradiation density) at the optical surface that is to be expected in the operating case and varies in a location-dependent manner, wherein the determination is typically effected via computer simulations. The concrete conditions that occur during the operation of the optical arrangement can be used for the determination. In the case of an optical arrangement in the form of a projection lens for an (EUV) lithography apparatus, one such parameter is e.g. the average radiation power of the illumination radiation downstream of the object to be imaged (mask), which can be for example in the range of several watts (for approximately 1 watt or 5 watts to approximately 30 watts). Further parameters are the illumination settings used, e.g. dipole illumination or annular illumination, and the structures to be imaged on the mask. Since the structures to be imaged on the mask are different depending on the application, it is possible to use for the simulation structures to be imaged which constitute an appropriate mixture or averaging of dense lines, semidense lines and isolated lines (if appropriate including contact holes), such as usually occur in the case of masks used for exposure.

In a subsequent step, on the basis of the simulated irradiation power which enters into the projection lens, the local irradiance dependent on the optical design at the respective optical surface is determined and a temperature distribution at the surface and/or in the substrate is determined therefrom. In this case, besides the absorption and the thermal conductivity of the substrate, it is also possible to take account of heat transfer mechanisms into the environment, e.g. thermal radiation and also the emission of heat to a convective (residual) gas. For the determination of the temperature distribution, it is possible to have recourse to finite element methods.

Afterwards, the maximum and also the minimum of the temperature distribution and also the temperature averaged over the surface are determined, and these values are compared with one another in order to determine whether the zero crossing temperature of the substrate should be chosen to be greater than the average temperature to be expected at the surface. If this is the case, a blank composed of a substrate material having a corresponding zero crossing temperature is used for the production of the optical element. In order to produce the optical element, the substrate is firstly processed to produce the desired form or geometry of the optical surface. A reflective coating having a high reflection for example for EUV radiation at a specific wavelength can subsequently be applied to the optical surface.

It goes without saying that, depending on the comparison between the average temperature and the difference between maximum and minimum temperature at the surface, it is also possible to choose a substrate material whose zero crossing temperature corresponds to the average temperature or for which the zero crossing temperature is below the average temperature. As explained further above, however, in the case of a low pupil filling (<50%), typically at least for optical elements in proximity to the pupil the zero crossing temperature should systematically be chosen to be above the average temperature.

In one variant, the method comprises: determining deformations of the optical surface that are caused by the location-dependently variable temperature distribution, and choosing the zero crossing temperature in such a way that a measure of the wavefront aberration at the optical surface is minimized. On the basis of the temperature distribution at the optical surface and also in the underlying substrate, it is possible to determine the stresses in the substrate and also the resulting length changes or deformations of the surface. The measure of the wavefront aberration caused by the deformations can be, for example, the so-called RMS value (root mean square) or a value dependent thereon (e.g. $RMS^2$ value).

However, specific aberrations resulting from numerical decomposition of the wavefront into a preferably orthonormal function system, e.g. into Zernike polynomials, can also serve as a measure of the wavefront aberrations. The associated coefficients of the decomposition (Zernike coefficients) or combinations of these coefficients at different locations of the optical surface are characteristic of specific types of wavefront aberrations. For a given surface deformation dependent on the zero crossing temperature, it is possible to determine a suitable measure of the wavefront aberration and to find a zero crossing temperature at which the associated measure, e.g. the RMS value, becomes minimal. The measure of the wavefront aberration generally includes only that portion of the deformations which cannot be compensated for in some other way, for example by manipulators which bring about a compensation by movement of the optical element in accordance with its rigid-body degrees of freedom or, if appropriate, a local deformation of the optical surface.

In a further variant, determining the local irradiance, the temperature distribution and deformations of the optical surface that are caused by the temperature distribution is carried out for all the optical elements of the optical arrangement, and a respective optical element is produced from a substrate having a zero crossing temperature chosen such that a measure of the wavefront aberration (e.g. image aberration in the image plane) or the wavefront aberrations of the optical arrangement is minimized. In this case, the residual optical aberrations produced by a projection lens in the image plane are simulated. These aberrations can be assessed on the basis of their effect on the image generated by the projection lens and it is possible to check whether the aberrations are within the specification, that is to say within a predefined interval. The aberrations of the projection lens are dependent on the specific zero crossing temperature of the respective optical elements. The zero crossing temperatures of the individual optical elements can be varied during the simulation until an optimum or minimum of the aberrations or image aberrations in the image plane is found which fulfils the specification. The image aberrations include, inter alia, scale error, telecentricity error, overlay, depth of focus, best focus, etc., which result from integration or summation of the wavefronts measured at a plurality of points of the image plane or of the Zernike coefficients measured there (see above). Moreover, the Zernike coefficients at different image points can be grouped into RMS values which are characteristic of a specific type of aberration or image aberration, e.g. coma, astigmatism, etc.

In a further variant, the temperature distribution at the optical surface is time-dependent, and a temperature distribution at a point in time at which the measure of the wavefront aberration is maximal is used for the choice of the zero crossing temperature. As explained further above, the optical arrangement has a transient state between an inactive state and the operating case, in which transient state the optical elements are heated to their (steady-state) operating temperature by the incident radiation. The optimization of the wavefront aberrations for temperature states of the optical elements at different points in time during the heating phase typically does not lead to the same zero crossing temperature; rather, the zero crossing temperature required for minimal wavefront aberrations is time-dependent. Since only a single zero crossing temperature can be defined, it is therefore necessary to make a selection from the zero crossing temperatures that occur during heating. For such a selection, it is possible to select the zero crossing temperature of the point in time at which the aberrations are the greatest. This value can be compared with the specification and checked as to whether the specification is fulfilled. If that is not the case, it is possible, if appropriate, to make modifications to the optical design of the projection lens. This makes it possible to ensure that the result of the optimization still fulfils the specification even in the worst case.

In a further variant, the method additionally comprises: choosing the zero crossing temperature in such a way that the zero crossing temperature has a predefined difference with respect to the average temperature, the difference being dependent on the local irradiance. In this case, not only is the average temperature chosen to be lower than the zero crossing temperature, but in addition the deviation (difference) of the average temperature from the zero crossing temperature is defined in a manner dependent on the local irradiance which affects the frequency distribution of the temperature and thus the wavefront aberrations caused at the optical surface. In this case, in particular, a respective local irradiance can be assigned to a respective operating case that is characterized by specific operating parameters (e.g. illumination settings, radiation intensity of the light source, etc.).

In one development of this variant, the predefined difference between the zero crossing temperature and the average temperature is given by $½<\delta T^3>/<\delta T^2>$, wherein $\delta T(x,y)$ designates the deviation of the location-dependent temperature distribution from the average temperature of the optical surface. As explained further above, the RMS value of the optical surface can be minimized by such a fixing of the zero crossing temperature.

Further features and advantages of the invention are evident from the following description of exemplary embodiments of the invention, with reference to the figures of the drawing, which show details essential to the invention and from the claims. The individual features can be realized in each case individually by themselves or as a plurality in any desired combination in a variant of the invention.

DRAWING

Figure 2:
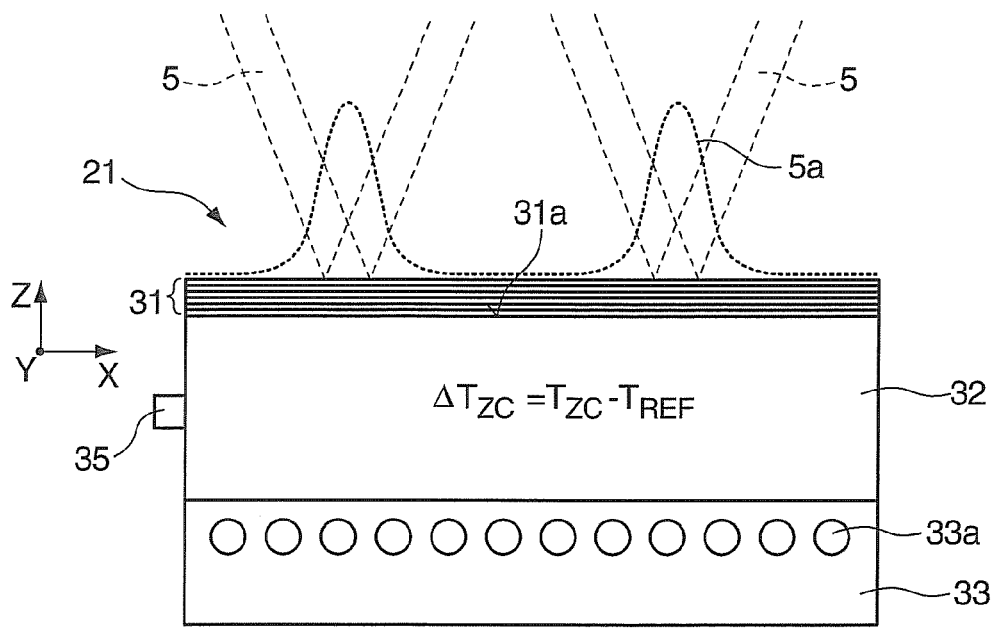
Figure 3A:
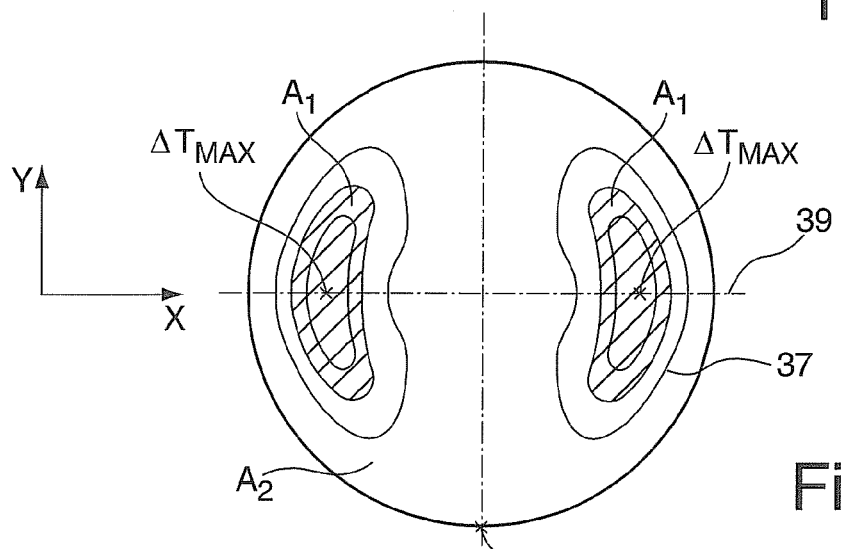
Figure 3B:
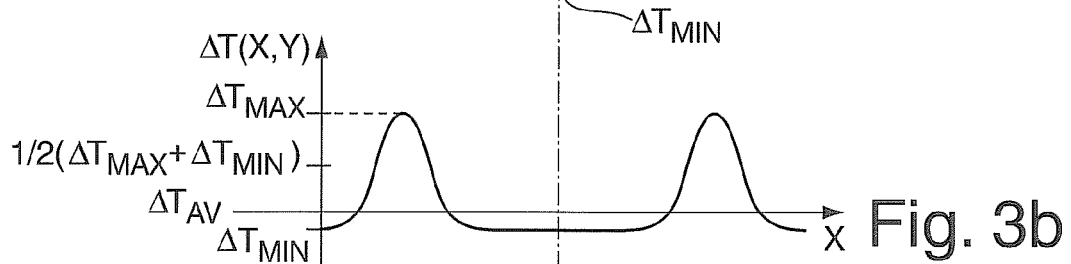
Figure 3C:
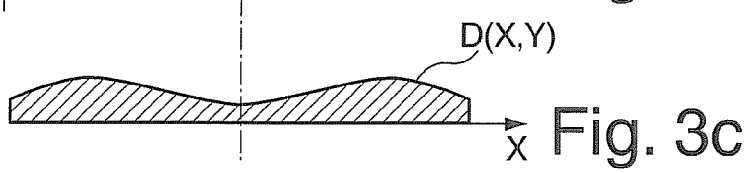
Figure 4:
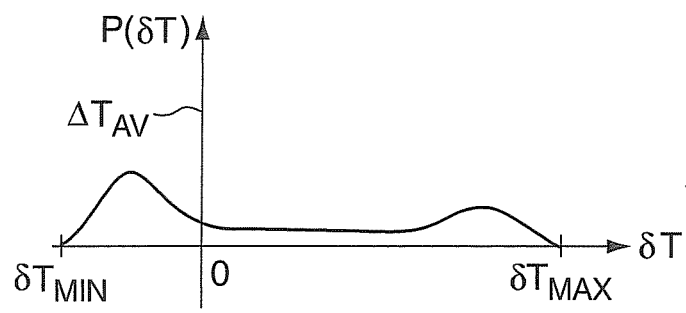
Figure 5:
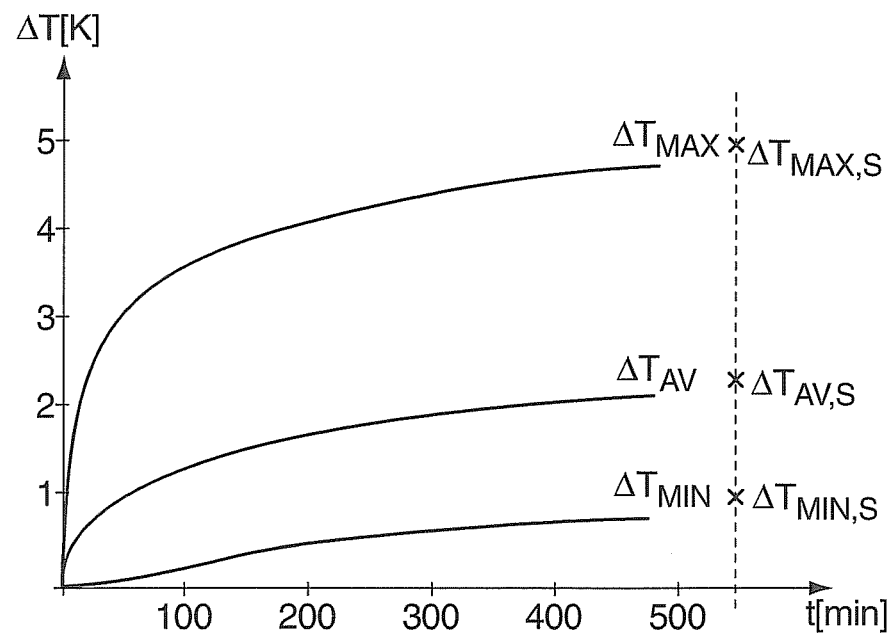

Exemplary embodiments are illustrated in the schematic drawing and are explained in the description below. In the figures:

FIG. 1 shows a schematic illustration of an EUV lithography apparatus comprising an illumination system and a projection lens, FIG. 2 shows a schematic illustration of an EUV mirror for the projection lens from FIG. 1, FIGS. 3a-c show schematic illustrations of a location-dependent temperature distribution and of deformations resulting therefrom at an optical surface of the EUV mirror from FIG. 2, FIG. 4 shows a schematic illustration of a frequency distribution of the temperature values at the surface of the EUV mirror from FIG. 2, and FIG. 5 shows an illustration of the time-dependent temperature profile during the heating of the optical surface of the EUV mirror from FIG. 2 to its steady-state operating temperature.

FIG. 1 schematically shows an EUV lithography apparatus 1. The latter comprises an EUV light source 2 for generating EUV radiation having a high energy density in an EUV wavelength range of less than 50 nm, in particular between approximately 5 nm and approximately 15 nm. The EUV light source 2 can be embodied for example in the form of a plasma light source for generating a laser induced plasma or as a synchrotron radiation source. In the former case, in particular, as shown in FIG. 1, a collector mirror 3 can be used in order to concentrate the EUV radiation of the EUV light source 2 to form an illumination ray 4 and, in this way, to increase the energy density further. The illumination ray 4 serves for illuminating a patterned object M via an illumination system 10, which comprises four reflective optical elements 13 to 16 in the present example.

The patterned object M can be a reflective mask, for example, which has reflective and non-reflective or at least less-reflective regions for producing at least one structure on the object M. Alternatively, the patterned object M can be a plurality of micromirrors which are arranged in a one- or multidimensional arrangement and which, if appropriate, are moveable about at least one axis in order to set the angle of incidence of the EUV radiation 4 on the respective mirror.

The patterned object M reflects part of the illumination ray 4 and shapes a projection ray 5, which carries the information about the structure of the patterned object M and which is radiated into a projection lens 20, which generates an imaging of the patterned object M or of a respective partial region thereof on a substrate W. The substrate W, for example a wafer, comprises a semiconductor material, e.g. silicon, and is arranged on a mount, also designated as a wafer stage WS.

In the present example, the projection lens 20 comprises four reflective optical elements 21 to 24 (mirrors) in order to generate an image of the structure present on the patterned object M on the wafer W. Typically, the number of mirrors in a projection lens 20 is between four and eight, but if appropriate just two mirrors can also be used.

In order to achieve a high imaging quality during the imaging of a respective object point OP of the patterned object M onto a respective image point IP on the wafer W, extremely stringent requirements have to be imposed with regard to the surface shape of the mirrors 21 to 24 and the position or the orientation of the mirrors 21 to 24 with respect to one another or relative to the object M and to the substrate W also requires a precision in the nanometers range. In particular, a diffraction-limited imaging enabling the maximum possible resolution can be generated only when the wavefront aberrations of the projection lens 20 are sufficiently small. In the case of a diffraction-limited projection lens 20, the RMS value (root mean square) of the wavefront aberrations should be less than $1/14$ of the wavelength of the imaging light. In order to achieve this, the surface shape of the mirrors 21 to 24 has to be set with high precision and the mirrors 21 to 24 likewise have to be positioned very precisely.

During the operation of the projection lens 20, the problem occurs that a proportion of the radiation of the projection ray 5, which can be up to approximately 70%, is absorbed by a respective optical element 21 to 24. Depending on the quantity of absorbed radiation, heating occurs in a respective mirror 21 to 24 and, as a result, a thermal expansion occurs which leads to deformations of the reflective surfaces of the respective mirrors 21 to 24, which can alter the orientation or the surface shape of the mirrors 21 to 24 in an undesirable manner. One possibility for combating this problem is to use an open-loop or closed-loop control device 30 for setting the operating temperature or the (average) temperature of the individual mirrors 21 to 24. Changes in the expansion of a respective mirror 21 to 24 or of the associated substrate which are caused by fluctuations in temperature can be kept small in this way.

In the case of the projection lens 20 shown in FIG. 1, all four mirrors 21 to 24 comprise $TiO_2$-doped quartz glass (ULE®) as substrate material. FIG. 2 shows by way of example the first mirror 21 of the projection lens 20 in a schematic illustration. The first mirror 21 comprises a substrate 32 composed of ULE®, the $TiO_2$ proportion of which is chosen such that the substrate 32 has a desired zero crossing temperature $T_{ZC}$ (which is as constant as possible over the substrate volume). For the following considerations, the zero crossing temperature $T_{ZC}$ and also further temperature-dependent variables $T_a$ are related to a reference temperature $T_{ref}$ (that is to say that $\Delta T_{ZC}=T_{ZC}-T_{ref}$ and $\Delta T_a=T_a-T_{ref}$). The reference temperature $T_{ref}$ denotes a (steady-state) temperature state that is present in the substrate material 32 or in the projection lens 20 when no illumination ray 4 is fed to the EUV lithography apparatus 1. Typically, the reference temperature $T_{ref}$ corresponds to the ambient temperature and can be e.g. room temperature (approximately 22° C.).

A reflective coating 31 is applied to the substrate 32, the reflective coating comprising a plurality of individual layers (not designated in more specific detail) which consist alternately of materials having different reflective indices. If EUV radiation at a wavelength in the range of 13.5 nm is used in the projection lens 20, then the individual layers usually consist of molybdenum and silicon. Other material combinations such as e.g. molybdenum and beryllium, ruthenium and beryllium or lanthanum and $B_4C$ are likewise possible. In addition to the individual layers, a reflective coating can also comprise intermediate layers for preventing diffusion and also a capping layer for preventing oxidation and/or corrosion. The top side of the substrate 32 is designated hereinafter as reflective or optical surface 31a, even though strictly speaking the reflective coating 31 as a whole brings about the reflection of the EUV radiation.

The substrate 32 is applied to a carrier 33, in which a plurality of heating/cooling elements 33a in the form of Peltier elements are provided, which serve for heating, if appropriate also cooling, the substrate 32 as homogeneously as possible to a working temperature, which is also designated as average temperature $\Delta T_{av}$. As a result of the projection ray 5, to put it more precisely as a result of the local irradiance 5a of the projection ray, the local irradiance being illustrated for a dipole illumination in FIG. 2, a location-dependently varying temperature distribution $\Delta T(x, y)=T(x,y)-T_{ref}$ arises at the optical surface 31a, the temperature distribution being illustrated in a plan view and respectively in a sectional illustration along the X-direction of an XYZ coordinate system in FIGS. 3a,b. In order to simplify the illustration, a planar optical surface 31a was assumed in this case, but it goes without saying that the optical surface 31a typically has an (e.g. spherical) curvature.

It goes without saying that, as an alternative or in addition to the Peltier elements 33a, it is also possible to provide other devices for regulating the temperature of the substrate 32 and/or of the optical surface 31a, for example heating wires. Moreover, temperature regulation can be effected by applying thermal radiation to the optical surface 31a. The thermal radiation can be generated e.g. by infrared radiation-emitting diodes or with the aid of IR lasers which are arranged at a distance from the optical surface. The IR radiation can be guided if appropriate with the aid of optical fibres or light guiding rods to the optical surface 31a and/or into the vicinity of the substrate 32. In this case, the thermal radiation can be introduced into the substrate 32 from below (from the carrier 33) but it is also possible, if appropriate, to radiate the thermal radiation onto the optical surface 31a directly from outside (from a location outside the projection ray 5).

The location-dependent temperature distribution $\Delta T(x, y)$ at the surface of the mirror 21 is related to the reference temperature $T_{ref}$ (which is constant over the surface), which, in the present example, is the ambient temperature of the mirror 21, corresponding to room temperature ($T_{ref}=22°$ C.). The temperature distribution $\Delta T(x, y)$ can be represented as the sum of a value averaged over the surface $\langle\Delta T(x, y)\rangle=\Delta T_{av}=\langle\Delta T\rangle=$const. (typically obtained by integration of the temperature distribution $\Delta T(x, y)$ over all locations of the surface 31a, divided by the total area) and a (location-dependent) deviation $\Delta T(x, y)$ from the average value $\Delta T_{av}$:

$$\Delta T(x,y)=\Delta T_{av}+\delta T(x,y)=\langle\Delta T\rangle+\delta T(x,y).$$

In this case, the value of the deviation $\delta T(x, y)$ that is averaged over the surface vanishes by definition, that is to say that $\langle\delta T\rangle=0$ holds true.

Ideally, the zero crossing temperature $\Delta T_{ZC}=T_{ZC}-T_{ref}$ related to the reference temperature $T_{ref}$ is constant over the substrate volume and thus over the reflective surface 31a. A power series expansion of a surface deformation $D(x, y)$ resulting from the location-dependent variation of the temperature distribution $\Delta T(x, y)$ depending on the temperature deviation $\delta T(x, y)$ and the average value $\langle\Delta T\rangle$ yields:

$$D(x,y)=D_{hom}+\gamma(\langle\Delta T\rangle-\Delta T_{ZC})\delta T(x,y)+\frac{1}{2}\gamma\delta T^2(x,y), \quad (1)$$

wherein $\gamma$ denotes the (constant) gradient of the coefficient of thermal expansion at the zero crossing temperature $\Delta T_{ZC}$.

The homogeneous thermal expansion $D_{hom}$ of the surface of the mirror can typically be corrected well (e.g. with the aid of manipulators), and so this is not discussed in any greater detail here. Initially it appears plausible that the optimum average temperature $\langle\Delta T\rangle$ for the operation of the mirror 21 corresponds to the zero crossing temperature $\Delta T_{ZC}$ since the linear term in Equation (1) is omitted in this case.

It is subsequently shown, however, that for minimizing the wavefront aberrations of the mirror (expressed by the RMS ("root mean square") value in the present example) it is more advantageous in specific cases if the average value $\langle\Delta T\rangle$ of the temperature distribution at the mirror surface does not correspond to the zero crossing temperature $\Delta T_{ZC}$. The RMS value (or the square thereof, also designated by RMS$^2$) is dependent on the deformations $D(x,y)$ at the reflective surface 31a as follows:

$$RMS^2=\langle(D-\langle D\rangle)^2\rangle=\langle D^2-2D\langle D\rangle+\langle D\rangle^2\rangle=\langle D^2\rangle-2\langle D\rangle^2+\langle D\rangle^2, \text{ i.e.}$$
$$RMS^2=\langle D^2\rangle-\langle D\rangle^2 \quad (2)$$

The RMS$^2$ value is a measure of the deformation of the surface and corresponds to the variance of the distribution of the deformations $D(x,y)$ at the surface, while the RMS value corresponds to the standard deviation.

Via averaging, the following arises from Equation (1):

$$\langle D\rangle=\gamma(\langle\Delta T\rangle-\Delta T_{ZC})\langle\delta T\rangle+\frac{1}{2}\gamma\langle\delta T^2\rangle=\frac{1}{2}\gamma\langle\delta T^2\rangle, \text{ i.e.}$$
the following holds true:

$$\langle D\rangle^2=1/4\gamma^2\langle\delta T^2\rangle^2$$

Taking account of the homogeneous contribution $D_{hom}$ was omitted here and use was made of the fact that $\langle\delta T\rangle=0$ holds true (see above).

Squaring Equation (1) and averaging yields:

$$\langle D^2\rangle=\gamma^2(\langle\Delta T\rangle-\Delta T_{ZC}))^2\langle\delta T^2\rangle+\gamma^2(\langle\Delta T\rangle-\Delta T_{ZC}))\langle\delta T^3\rangle+\frac{1}{4}\gamma^2\langle\delta T^4\rangle$$

For the optimization (determination of the extreme value), the RMS value (or RMS$^2=\langle D^2\rangle-\langle D\rangle^2$) is differentiated with respect to the zero crossing temperature $\Delta T_{ZC}$ and the result is set to be equal to zero. The following should hold true:

$$d\text{RMS}^2/d\Delta T_{ZC}=-2\gamma^2(\langle\Delta T\rangle-\Delta T_{ZC}))\langle\delta T^2\rangle-\gamma^2\langle\delta T^3\rangle=0$$

Solving for the zero crossing temperature $\Delta T_{ZC}$ yields:

$$\Delta T_{ZC}=\langle\Delta T\rangle+\frac{1}{2}\langle\delta T^3\rangle/\langle\delta T^2\rangle \quad (3)$$

The correction term $\frac{1}{2}\langle\delta T^3\rangle/\langle\delta T^2\rangle$ takes account of the asymmetry in the frequency distribution of the temperature values at the reflective surface 31a. If the temperature distribution is a (for example Gaussian) distribution that is symmetrical with respect to the average value $\langle\Delta T\rangle$, the correction term vanishes since in this case $\langle\delta T^3\rangle=0$ holds true for reasons of symmetry.

In the case of EUV mirrors, however, the temperature distribution is generally highly asymmetrical, wherein it holds true, in particular, that $|\delta T_{MIN}|<|\delta T_{Max}|$, as is illustrated by way of example on the basis of a frequency distribution $P(\delta T)$ in FIG. 4. In the case of the distribution shown in FIG. 4, $\langle\delta T^3\rangle$ is greater than zero and the optimum zero crossing temperature $\Delta T_{ZC}$ is therefore above the average temperature $\langle\Delta T\rangle$. Such an asymmetrical form of the frequency distribution in which the optimum zero crossing temperature $\Delta T_{ZC}$ is above the average temperature $\langle\Delta T\rangle$ is systematically provided when the average temperature $\langle\Delta T\rangle$ or $\Delta T_{av}$ is less than the average value $\frac{1}{2}(\Delta T_{max}+\Delta T_{min})$ formed from the maximum temperature $\Delta T_{max}$ and the minimum temperature $\Delta T_{min}$, cf. FIG. 3b.

This condition can also be expressed on the basis of the location-dependent temperature distribution $\Delta T(x, y)$ at the reflective surface 21a, such as is illustrated in FIG. 3a, and in which a first area portion $A_1$ (illustrated in a hatched fashion), at which the temperature $\Delta T(x, y)$ is greater than the average temperature $\Delta T_{av}$, has a smaller surface area than a second area portion $A_2$, at which the temperature $\Delta T(x, y)$ is less than the average temperature $\Delta T_{av}$, that is to say that $A_1<A_2$ holds true.

The temperature distribution $\Delta T(x, y)$ at the optical surface 31a, as illustrated in FIGS. 3a, b, substantially corresponds to the angular distribution of the illumination ray 4 upon entry into the projection lens 20, since the first EUV mirror 21 is arranged in proximity to a pupil plane 25, at which the location-dependent illuminance corresponds substantially (convolved with the diffraction structures on the mask M) with the field distribution in the pupil plane of the illumination system 10.

The choice of a zero crossing temperature $\Delta T_{ZC}$ above the average temperature $\Delta T_{av}$ is therefore advantageous, in particular on optical elements 21 in proximity to the pupil, if the illumination system 10 generates an illumination ray 4 with an illumination pupil which has a pupil filling of less than 50%, preferably of less than 30%, particularly preferably of less than 15%, in particular of less than 1%, that is to say if only a corresponding area portion of the illumination pupil is illuminated. In this case, the condition $A_1<A_2$ is typically met at the optical surface 31a of an optical element in proximity to the pupil. This condition may, if appropriate, also be met at optical elements which are arranged in proximity to a field plane, if the local irradiance impinging there produces an asymmetrical temperature distribution in which the condition $A_1<A_2$ is met. In this case, depending on the degree of asymmetry of the temperature distribution, the zero crossing temperature $\Delta T_{ZC}$ can be chosen to be at least 0.1 K, if appropriate at least 0.2 K, in particular at least 0.4 K, greater than the average temperature $\Delta T_{av}$ at the optical surface 31a. Conversely, if $A_2<A_1$ (or $A_1=A_2$) at an optical element, then it is also possible, if appropriate, to choose an average temperature $\Delta T_{av}$ which is greater than (or equal to) the zero crossing temperature $\Delta T_{ZC}$ of the respective substrate.

It goes without saying that besides optimization or minimization of the wavefront aberration at each individual mirror 21 to 24, it is also possible to effect an optimization of the aberrations of the entire projection lens 20, that is to say of wavefront aberrations or of image aberrations which are produced by the projection lens 20 in the image plane. For the optimization of the entire wavefront aberrations of the projection lens, at individual mirrors 21 to 24 it is also possible, if appropriate, to deviate from an average temperature $\Delta T_{av}$, which minimizes the wavefront aberration at the respective mirror 21 to 24, provided that the wavefront aberration of the entire projection lens 20 is improved by this deviation. As a measure of the wavefront aberration in the image plane of the projection lens 20, as an alternative or in addition to the RMS value, it is possible to use other image aberrations, e.g. overlay, depth of focus, best focus, etc., or specific aberrations such as coma, astigmatism, etc. These wavefront aberrations can be measured or simulated in the aerial image, for example, and the dependence of these aberrations on the temperature-dictated deformations of the individual mirrors 21 to 24 can be determined. Via the temperature control device 30, on the basis of this known dependence it is possible to set a suitable difference between average temperature $\Delta T_{av}$ and zero crossing temperature $\Delta T_{ZC}$ at a respective mirror 21 to 24, in order to minimize the used measure of the wavefront aberration in the image plane.

In order to set the desired average temperature $\Delta T_{av}$ even in the case of a temporally variable intensity of the projection ray 5 on the reflective surface 31a of the optical element 21 or of all the optical elements 21 to 24 of the projection lens 20 or in order to keep the average temperature $\Delta T_{av}$ constant, it is likewise possible to use the temperature control device 30 shown in FIG. 1, which serves for driving the heating device 33a (and/or further heating devices not shown) for the further mirrors 22 to 24). In order that the temperature of the substrate 32 can be controlled to the desired average temperature $\Delta T_{av}$ by closed-loop control, a temperature sensor 35 is provided laterally on the substrate 32 in the example shown in FIG. 2, the temperature sensor being connected to the control device 30 via a connecting line (not shown). Alternatively or additionally, one or more temperature sensors (not shown) can also be embedded into the substrate 32 or into the volume of the substrate 32 in order to detect the temperature at different locations below the optical surface 31a. In this case, the temperature sensors can be read via connecting lines that are led out from the substrate 32. If appropriate, the read-out can also be effected contactlessly via an optical interface or the like.

Via the temperature control device 30, it is also possible to set a desired difference between the average temperature $\Delta T_{av}$ and the zero crossing temperature $\Delta T_{ZC}$, the difference being dependent on the local irradiance 5a or on the respective application, wherein the difference can be determined in accordance with Equation (3), for example. In particular, it is possible to determine or simulate in advance the expected local irradiance or irradiation intensity 5a for specific operating parameters (e.g. dipole illumination, annular illumination, etc.) and to determine an appropriate difference $\Delta T_{av}-\Delta T_{ZC}$ on the basis of Equation (3), for example. The assignment between the operating parameters and the difference respectively to be chosen can be stored in the temperature control device 30 in order to be able to select or set the desired difference depending on the operating parameters. However, it is also possible, on the basis of a location-dependent temperature distribution measured or simulated during operation at the optical surface 31a, to determine or calculate the frequency distribution of the temperature at the surface 31a and also the effects thereof on the form of the surface 31a or the wavefront aberrations. This information can be used by the temperature control device 30 for setting the desired difference.

The temperature control device 30 can in particular also be used in the transient case, that is to say directly after illumination radiation 4 has been applied to the projection lens 20, in which the average temperature $\Delta T_{av}$ and also the maximum and minimum temperatures $\Delta T_{max}$, $\Delta T_{min}$ at the surface 31a of the mirror 21 (without additional heating) vary in a time-dependent manner until reaching a steady-state temperature state having a constant average temperature $\Delta T_{av,s}$ and respectively constant maximum and minimum temperatures $\Delta T_{max,s}$, $\Delta T_{min,s}$ cf. FIG. 5.

In order to reach the steady-state temperature state even without irradiation, the temperature control device 30 can be used for heating the mirrors 21 to 24 to the desired (steady-state) average temperature $\Delta T_{av,s}$ before illumination radiation is applied to the projection lens 20. In this case, the heating power of the heating device 33a in the transient case, in which the illumination radiation is additionally absorbed by the respective substrate 32, should be adapted such that the total thermal power (sum of the radiation power and heating power) taken up by the substrate and thus the average temperature of the substrate 32 and/or of the optical surface 31a remain constant, that is to say that the heating power should be gradually reduced in the transient case in order to keep the average temperature $\Delta T_{av}$ as constant as possible.

As explained above, it is possible to minimize wavefront aberrations at the individual mirrors 21 to 24 or of the entire projection lens 20 by the average temperature $\Delta T_{av}$ of the mirror surface and the zero crossing temperature $\Delta T_{ZC}$ being suitably adapted to one another. As explained above, such an adaptation can be effected with the aid of a temperature control device 30 which sets the average temperature $\Delta T_{av}$ at the respective reflective surface 31a in a suitable manner. However, the zero crossing temperature $\Delta T_{ZC}$ can be set only during the production or configuration of the projection lens 20, but not during operation. For configuring the projection lens 20 or for choosing a suitable zero crossing temperature $\Delta T_{ZC}$ of the substrate material 32 of a respective mirror 21 to 24, the following procedure can be adopted:

Firstly, the local irradiance 5a to be expected in the operating case at the optical surface 31a of the mirror 21 is determined, for which purpose a computer simulation of the illumination ray 4 entering into the projection lens 20 of the projection ray 5 is typically used. The temperature distribution at the optical surface 31a is then determined from the locally varying irradiance 5a, for which purpose, typically all heat conduction mechanisms (heat transfer into the substrate 32, but also thermal radiation at the surface 31a and heat emission to the residual gas) are taken into consideration. If it holds true for the temperature distribution $\Delta T(x, y)$ that $A_1 < A_2$ or that the average temperature $\Delta T_{av}$ is below the average value $\frac{1}{2}(\Delta T_{max} + \Delta T_{min})$ formed from the minimum and maximum temperatures $\Delta T_{min}$, $\Delta T_{max}$, the material of the substrate is chosen such that the zero crossing temperature $\Delta T_{ZC}$ thereof is greater than the average temperature $\Delta T_{av}$ corresponding to the expected operating temperature produced by the irradiation.

The average temperature $\Delta T_{av}$ in the operating case is the static temperature $\Delta T_{av,s}$ established after the heating of the mirrors 21 to 24. It goes without saying however, that the average temperature $\Delta T_{av}$ varies in a time-dependent manner in the transient case (cf. FIG. 5) if the temperature control device 30, in the transient case, does not ensure that the average temperature $\Delta T_{av}(t)$ at the optical surface 31a remains substantially constant. For the average temperature $\Delta T_{av}(t)$ present at a respective point in time t, a likewise varying optimum (that is to say aberration-minimizing) zero crossing temperature $\Delta T_{ZC}(t)$ arises in this case. Since the zero crossing temperature $\Delta T_{ZC}$ is finally defined after the production of the substrate 32, it is necessary to make a selection from the different zero crossing temperatures $\Delta T_{ZC}(t)$ in the transient case. This selection can be made for example in such a way that the zero crossing temperature $\Delta T_{ZC}(t)$ is selected at a point in time t* at which the resulting wavefront aberration is the greatest. This makes it possible to ensure that the wavefront aberrations are still within the specification even under the worst-case conditions.

By way of example, for checking whether the RMS value of the wavefront aberrations fulfils the specification, it is possible to compare the RMS value with a suitable threshold value, e.g. with a fraction (e.g. $\frac{1}{14}$, see above) of the wavelength of the EUV radiation, in order to ensure that the projection lens 20 is diffraction-limited. Of course, it is also possible to compare other measures of the wavefront aberration of the projection lens 20 with corresponding threshold values in order to determine whether they fulfil the specification.

The invention claimed is:

1. An optical arrangement, comprising:
   an optical element, comprising:
      an optical surface; and
      a substrate which comprises a material having a temperature-dependent coefficient of thermal expansion that is zero at a zero crossing temperature,
   wherein:
      during use of the optical arrangement, the optical surface has a location-dependent temperature distribution that: a) is dependent on a local irradiance; and b) has an average temperature, a minimum temperature and a maximum temperature;
      the average temperature of the location-dependent temperature distribution is less than half of a sum of the minimum temperature of the location-dependent temperature distribution and the maximum temperature of the location-dependent temperature distribution;
      the zero crossing temperature is greater than the average temperature;
      the difference between the zero crossing temperature and the average temperature of the location-dependent temperature distribution is $\frac{1}{2} < \delta T^3 > / < \delta T^2 >$; and
      $\delta T$ is a deviation of the location-dependent temperature distribution from the average temperature of the location-dependent temperature distribution.

2. The optical arrangement of claim 1, further comprising:
   a device configured to regulate a temperature of the optical element; and
   a temperature control device configured to set the average temperature of the optical surface.

3. The optical arrangement of claim 2, wherein the temperature control device is configured to set, for closed-loop control, the average temperature of the optical surface.

4. The optical arrangement of claim 2, wherein the temperature control device is configured to set, in a manner dependent on the local irradiance, a difference between the zero crossing temperature and the average temperature of the location-dependent temperature distribution.

5. The optical arrangement of claim 4, wherein the average temperature location-dependent temperature distribution is such that it minimizes a measure of the wavefront aberration at the optical surface.

6. The optical arrangement of claim 4, wherein the optical arrangement comprises a plurality of optical elements, and, for each of the optical elements, an average temperature location-dependent temperature distribution is such that it minimizes a measure of the wavefront aberration of the optical arrangement.

7. The optical arrangement of claim 6, wherein the measure of the wavefront aberration is selected from the group consisting of a RMS value, an overlay error, a scale error, a telecentricity error, a depth of focus, a best focus, coma and an astigmatism.

8. The optical arrangement of claim 2, wherein the temperature control device is configured to adapt a heating power of the temperature regulating device to a radiation power absorbed by the substrate so the average temperature of the location-dependent temperature distribution is constant.

9. The optical arrangement of claim 1, wherein the zero crossing temperature is at least 0.1 K greater than the average temperature of the location-dependent temperature distribution.

10. The optical arrangement of claim 1, wherein:
    the optical surface has a first area portion at which a temperature of the optical surface is greater than the average temperature of the location-dependent temperature distribution;
    a second area portion at which a temperature of the optical surface is less than the average temperature of the location-dependent temperature distribution; and
    the first area portion is smaller than the second area portion.

11. The optical arrangement of claim 1, wherein the optical surface is reflective to EUV radiation.

12. A lens, comprising:
    an optical arrangement according to claim 1,
    wherein the lens is an EUV projection lens.

13. An apparatus, comprising:
a projection lens comprising an optical arrangement according to claim 1,
wherein the apparatus is an EUV lithography apparatus.

14. The apparatus of claim 13, wherein the optical element is in the vicinity of a pupil plane.

15. The apparatus of claim 13, further comprising an illumination system.

16. The apparatus of claim 15, wherein the illumination system is configured to provide an illumination ray with an illumination pupil having a pupil filling of less than 50%.

17. A method for configuring an optical arrangement which comprises an optical element comprising an optical surface and a substrate, the substrate comprising a material having a temperature-dependent coefficient of thermal expansion that is zero at a zero crossing temperature, the method comprising:
determining a local irradiance at the optical surface of the optical element during use of the optical arrangement;
determining a location-dependent temperature distribution that results from the irradiance at the optical surface, the location-dependent temperature distribution having an average temperature, a minimum temperature and a maximum temperature;
determining a difference between the average temperature at the optical surface and the average value of the minimum temperature and the maximum temperatures; and
based on the difference, producing the optical element from a substrate whose zero crossing temperature is greater than the average temperature.

18. The method of claim 17, further comprising:
determining deformations of the optical surface caused by the location-dependent temperature distribution; and
choosing the zero crossing temperature to minimize the wavefront aberration at the optical surface.

19. The method of claim 18, further comprising measuring the wavefront aberration based on a parameter selected from the group consisting of a RMS value, an overlay error, a scale error, a telecentricity error, a depth of focus, a best focus, coma and an astigmatism.

20. The method of claim 18, wherein the temperature distribution at the optical surface is time-dependent, and a temperature distribution at a point in time at which the measure of the wavefront aberration is maximized is used for the choice of the zero crossing temperature.

21. The method of claim 17, further comprising determining deformations of the optical surface caused by the location-dependent temperature distribution, wherein:
determining the local irradiance, the location-dependent temperature distribution and deformations of the optical surface caused by the temperature distribution is performed for all optical elements of the optical arrangement; and
a respective optical element is produced from a substrate having a zero crossing temperature chosen to minimize a measure of the wavefront aberration of the optical arrangement.

22. The method of claim 17, further comprising choosing the zero crossing temperature so that the zero crossing temperature has a predefined difference with respect to the average temperature, and the difference is dependent on the local irradiance.

23. The method of claim 22, wherein the predefined difference between the zero crossing temperature and the average temperature is $\frac{1}{2}<\delta T^3>/<\delta T^2>$, wherein $\delta T$ designates the deviation of the location-dependent temperature distribution from the average temperature of the optical surface.

24. The method of claim 17, wherein the substrate is selected so that the difference between the zero crossing temperature and the average temperature is $\frac{1}{2}<\delta T^3>/<\delta T^2>$, and $\delta T$ designates the deviation of the location-dependent temperature distribution from the average temperature of the optical surface.

* * * * *

UNITED STATES PATENT AND TRADEMARK OFFICE
CERTIFICATE OF CORRECTION

PATENT NO. : 9,671,703 B2
APPLICATION NO. : 14/309017
DATED : June 6, 2017
INVENTOR(S) : Norman Baer, Toralf Gruner and Ulrich Loering It is certified that error appears in the above-identified patent and that said Letters Patent is hereby corrected as shown below:

On the Title Page

Column 2, Lines 13-14, under "ABSTRACT", delete "1/2 ($\Delta T_{max} + \Delta T_{min}$)" and insert -- 1/2($\Delta T_{max} + \Delta T_{min}$) --.

In the Specification

Column 1, Line 15, delete "0 2012 201 075.0" and insert -- 10 2012 201 075.0 --.

Column 1, Line 62, after "trade", delete "is".

Column 13, Line 3, delete "FIGS. 3a,b." and insert -- FIGS. 3a, b. --.

Column 14, Lines 20-21, delete "$<D^2> = \gamma^2 (<\Delta T> - \Delta T_{ZC}))^2 <\delta T^2> + \gamma^2 (<\Delta T> - \Delta T_{ZC})) <\delta T^3> + \frac{1}{4} \gamma^2 <\delta T^4>$" and insert -- $<D^2> = \gamma^2 (<\Delta T> - \Delta T_{ZC})^2 <\delta T^2> + \gamma^2 (<\Delta T> - \Delta T_{ZC}) <\delta T^3> + \frac{1}{4} \gamma^2 <\delta T^4>$ --.

Column 14, Lines 28-29, delete "$dRMS^2 / d\Delta T_{ZC} = -2 \gamma^2 (<\Delta T> - \Delta T_{ZC})) <\delta T^2> - \gamma^2 <\delta T^3> = 0$" and insert -- $dRMS^2 / d\Delta T_{ZC} = -2 \gamma^2 (<\Delta T> - \Delta T_{ZC}) <\delta T^2> - \gamma^2 <\delta T^3> = 0$ --.

Column 14, Lines 51-52, delete "½ ($\Delta T_{max} + \Delta T_{min}$)" and insert -- ½($\Delta T_{max} + \Delta T_{min}$) --.

Signed and Sealed this
Seventh Day of November, 2017

Joseph Matal
*Performing the Functions and Duties of the
Under Secretary of Commerce for Intellectual Property and
Director of the United States Patent and Trademark Office*